United States Patent [19]
Kessler et al.

[11] Patent Number: 5,745,153
[45] Date of Patent: Apr. 28, 1998

[54] OPTICAL MEANS FOR USING DIODE LASER ARRAYS IN LASER MULTIBEAM PRINTERS AND RECORDERS

[75] Inventors: David Kessler, Rochester, N.Y.; John G. Endriz, Belmont, Calif.

[73] Assignee: Eastman Kodak Company, Rochester, N.Y.

[21] Appl. No.: 986,207

[22] Filed: Dec. 7, 1992

[51] Int. Cl.⁶ .............................. B41J 2/47; G02B 27/10
[52] U.S. Cl. .................... 347/241; 347/244; 359/619
[58] Field of Search ................. 346/107 R, 108; 359/710, 619, 621, 626, 455; 347/241, 244, 251

[56] References Cited

U.S. PATENT DOCUMENTS

| | | | |
|---|---|---|---|
| 3,750,189 | 7/1973 | Fleischer | 347/137 |
| 3,852,767 | 12/1974 | Brooks et al. | 346/107.1 |
| 4,383,261 | 5/1983 | Goldberg | 347/224 |
| 4,520,472 | 5/1985 | Reno . | |
| 4,553,148 | 11/1985 | Behrens et al. | 347/244 |
| 4,743,091 | 5/1988 | Gelbart | 369/112 |
| 4,804,975 | 2/1989 | Yip . | |
| 4,895,790 | 1/1990 | Swanson et al. | 430/321 |
| 4,926,348 | 5/1990 | Francis | 347/241 X |
| 4,978,974 | 12/1990 | Etzel | 346/107 R |
| 5,014,075 | 5/1991 | Okino | 347/243 X |
| 5,109,460 | 4/1992 | Baek et al. . | |
| 5,146,242 | 9/1992 | Zielinski | 346/108 |
| 5,264,869 | 11/1993 | Appel et al. | 347/251 X |
| 5,337,074 | 8/1994 | Thornton | 347/237 |
| 5,369,661 | 11/1994 | Yamaguchi et al. | 372/69 |
| 5,475,416 | 12/1995 | Kessler et al. | 347/241 X |

FOREIGN PATENT DOCUMENTS

| | | | |
|---|---|---|---|
| A-0415903 | 3/1991 | European Pat. Off. . | |
| 61-043718 | 3/1986 | Japan | G02F 1/01 |

OTHER PUBLICATIONS

"Binary Optics in Lens Design", by Alan D. Kathman and S. Kenneth Pitalo in *The Proceedings of the SPIE*, vol. 1354, Jun., 1990;.

"Binary Optics: New Diffractive Elements for the Designer's Tool Kit", by Alan Kathman and Eric Johnson in *Phototonics Spectra*, Sep., 1992;.

"An Overview of binary optics at the Perkin–Elmer Corporation" by Thomas J. McHugh and Harold A. Levenstein in *SPIE*, vol. 884, 1988.

*Patent Abstracts of Japan, vol. 14, No. 469 (M–1034), 1990; & JP–A–02187369 (Fuji Xerox Co., Ltd.) *abstract*.

*Patent Abstracts of Japan, vol. 13, No. 570 (P–977), 1989; & JP–A–01238610 (NEC Corp.) *abstract*.

*Array Generation with Lenslet Arrays*, Streibel et al., vol. 30, No. 19, Jul. 1, 1991, pp. 2739–2742.

*Fast Diffraction–Limited Cylindrical Microlenses*, J. Synder et al., vol. 30, No. 19, Jul. 1, 1991, pp. 2743–2746.

*Geometrical Transformation of Linear Diode–Laser Arrays For Longitudinal Pumping Of Solid–State Lasers*, J. Leger et al., vol. 28, No. 4, Apr. 1, 1992, pp. 1088–1100.

*Primary Examiner*—David F. Yockey
*Attorney, Agent, or Firm*—Nelson Adrian Blish

[57] ABSTRACT

A laser multibeam printer or recorder includes a laser diode array generating multiple modulated parallel and diverging light beams with predetermined light intensities at any instant of time. Optical means reduce the divergence of the parallel light beams from the laser diode array by a predetermined amount, do not focus the light beams in a first cross-section direction along a width of the laser diode array, and focus the light beams onto a plane of an entrance pupil of a printing lens in a second cross-sectional direction normal to the first cross-sectional direction. A separate lenslet of a lenslet array directs a corresponding light beam from the laser diode array towards a predetermined area on a plane in front of the printing lens (e.g., the entrance pupil) in the first cross-sectional direction, and focuses the light beam onto the plane of the entrance pupil in a second cross-sectional direction. The printing lens images the light beams at the entrance pupil onto a light sensitive media as a corresponding array of closely-spaced spots of data with predetermined intensities. Various other arrangements using a field lens in combination with the lenslet array with or without a micro lenslet array can be used to process light beams and form an image of closely-spaced spots of light on the light sensitive media.

5 Claims, 6 Drawing Sheets

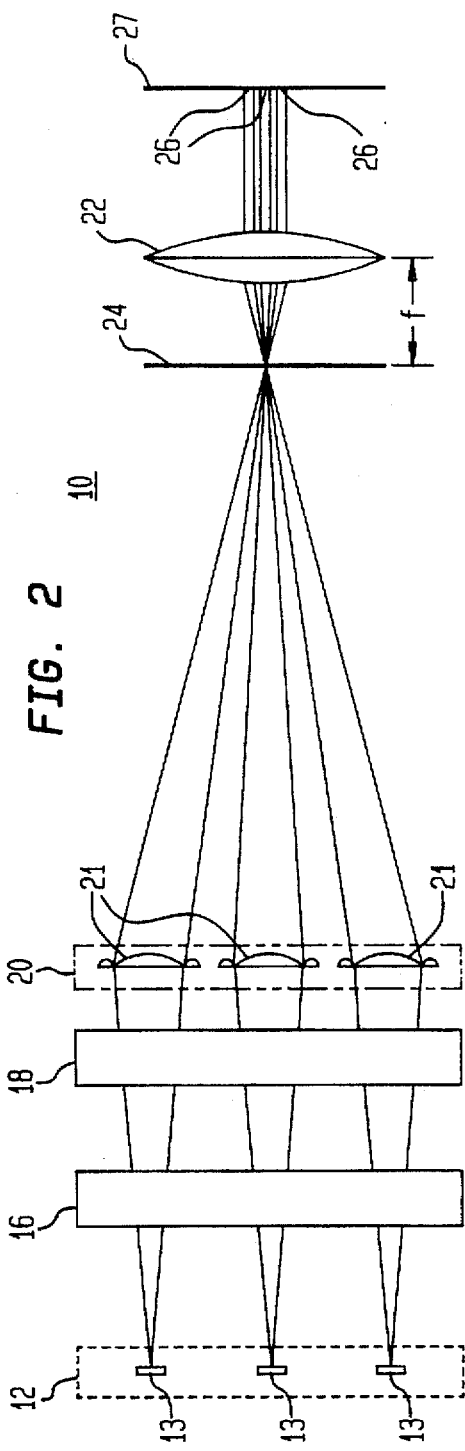
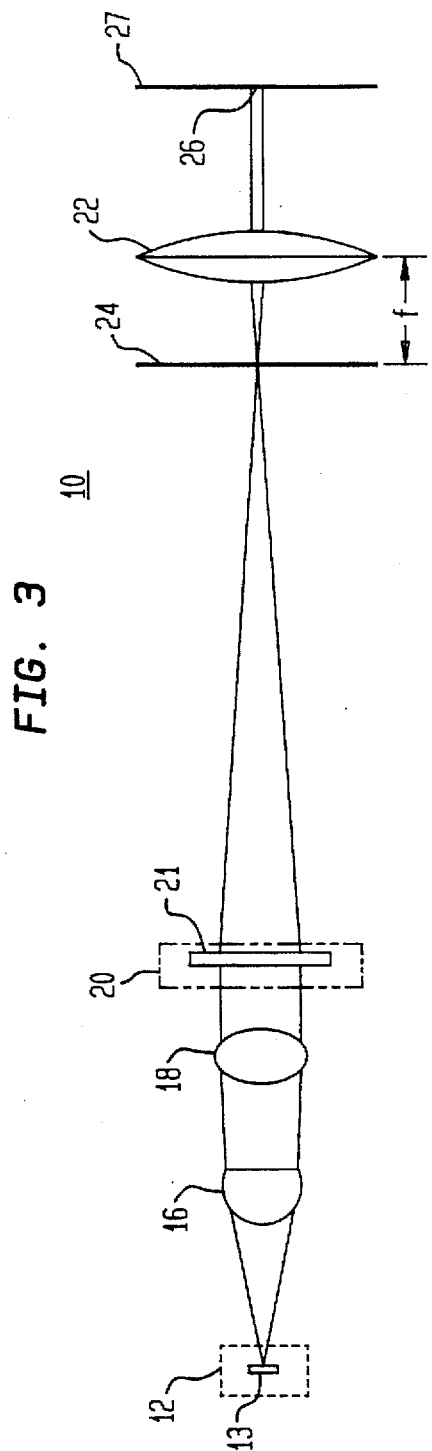
FIG. 2
FIG. 3

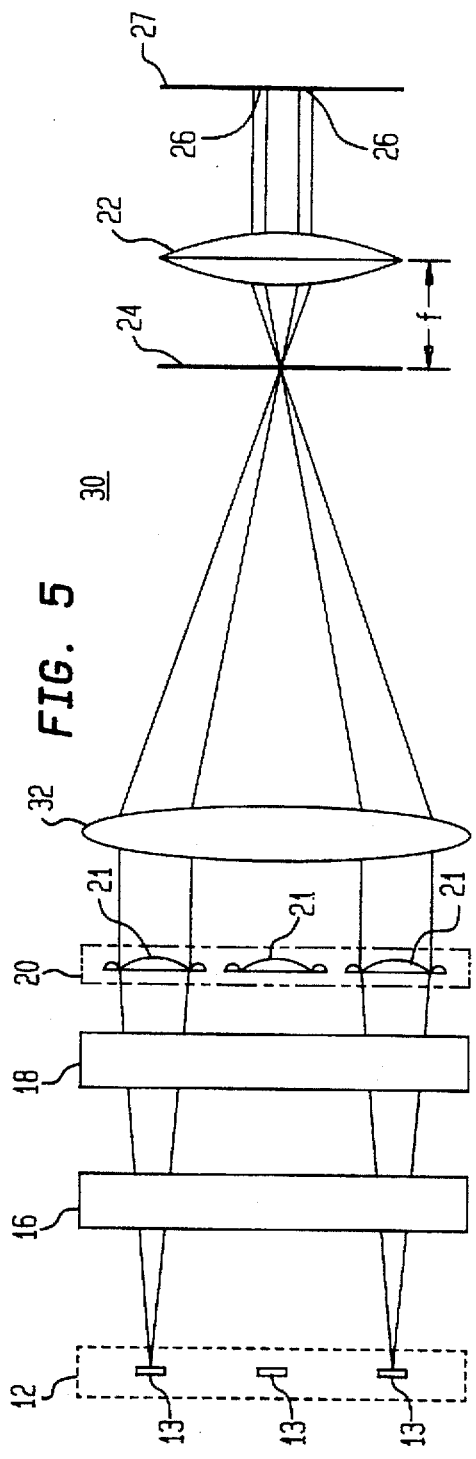
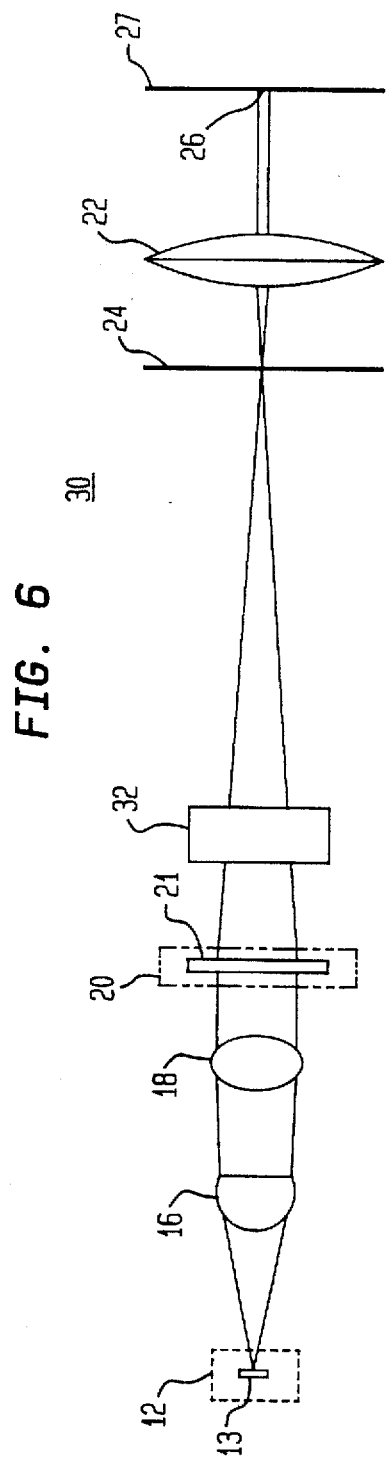

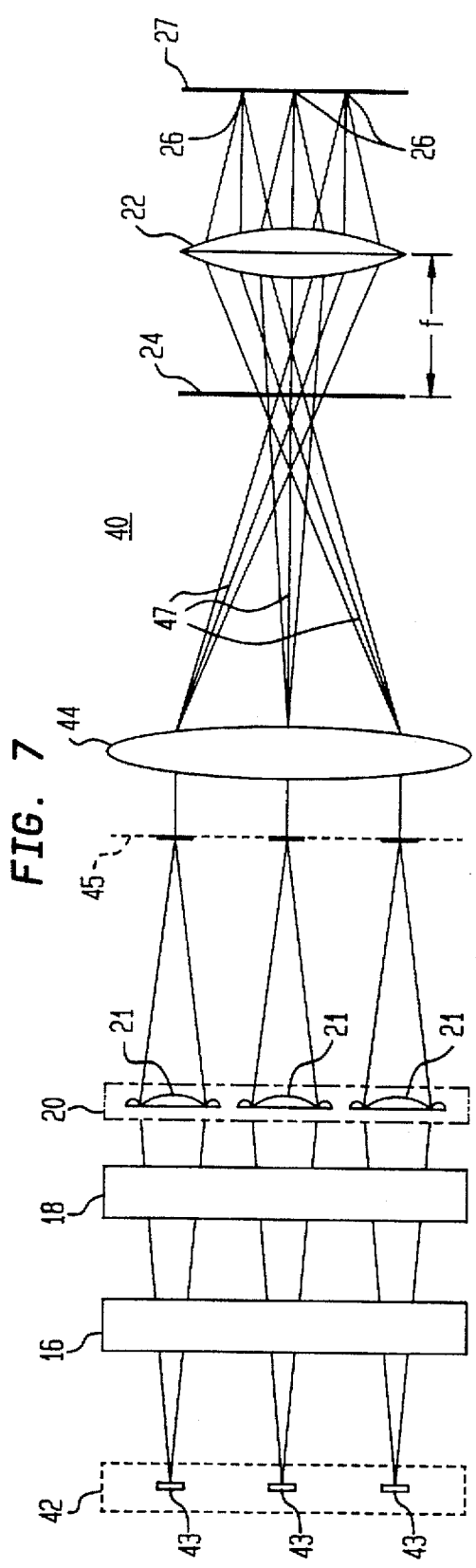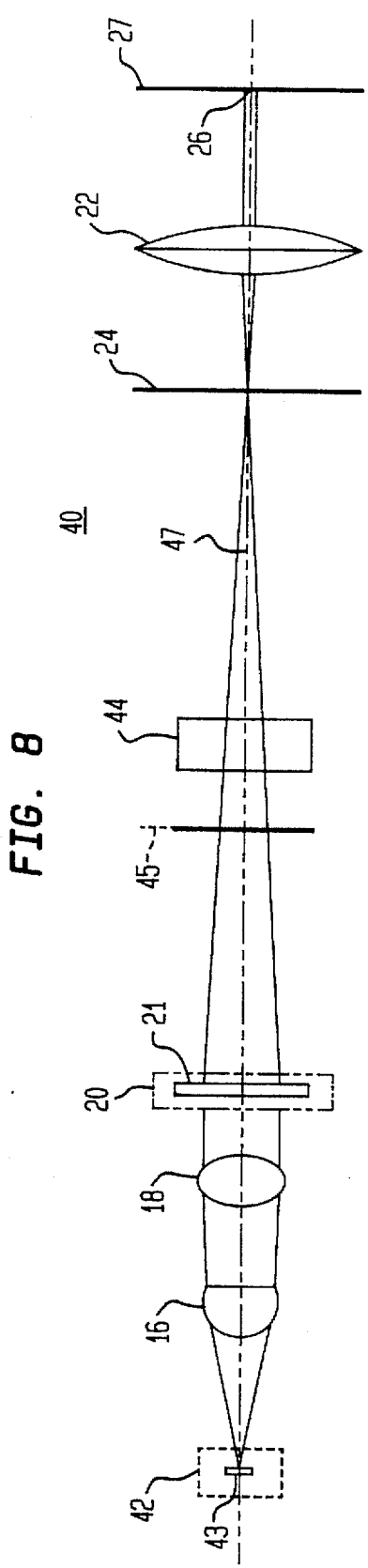

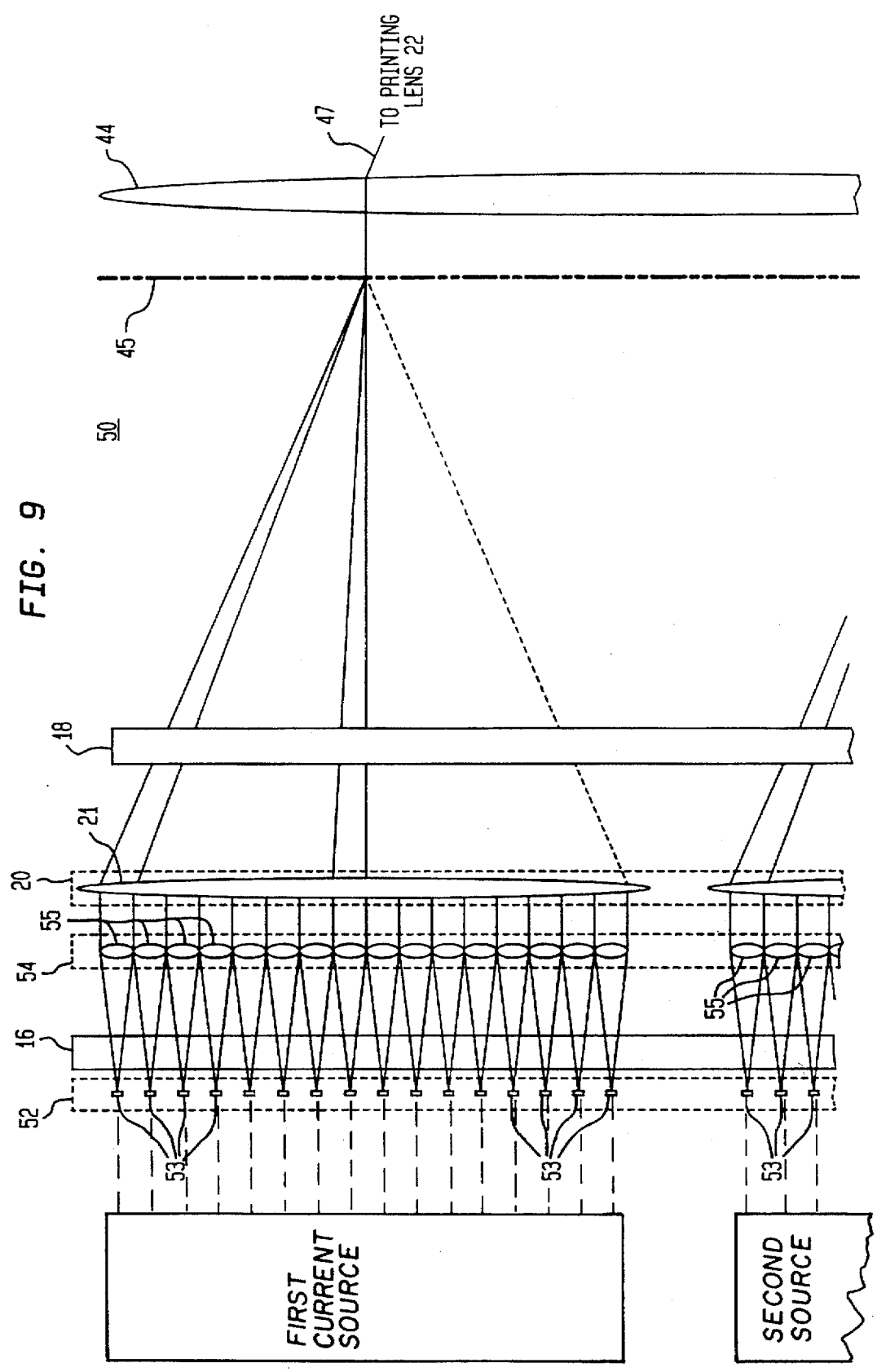

OPTICAL MEANS FOR USING DIODE LASER ARRAYS IN LASER MULTIBEAM PRINTERS AND RECORDERS

FIELD OF THE INVENTION

The present invention relates to techniques for efficiently using laser diode arrays in laser printer and recorders, and, more particularly, to the use of lenslet arrays with laser diode arrays in laser multibeam printers and recorders.

BACKGROUND OF THE INVENTION

In laser thermal printers, the optical power of lasers is used to affect a transfer of a dye or ink from a donor medium to a receiver member that form a recording medium. To enhance the printing speed of laser thermal printers, high power is needed. One technique for achieving high power in a laser thermal printer is to use a number of independently modulated diode lasers. U.S. Pat. No. 5,109,460 (S. Baek et al.), issued on Apr. 28, 1992, discloses an optical fiber print head system in which a number of independently modulated diode lasers are used, where each diode laser is coupled to an optical fiber. The other end of each of the optical fibers is placed in a grooved mount such that the fiber ends form a line of closely packaged spots forming a monolithic optical fiber head. This optical fiber head is then imaged onto a thermal dye media by a lens to form an array of closely spaced laser light spots.

U.S. Pat. No. 4,743,091 (D. Gelbart), issued on May 10, 1988, discloses an optical data storage apparatus in which numerous independently modulated diode lasers, each diode laser having a separate collimator lens, are arranged as a closely packed two dimensional array. A lens system is used to image the array onto an optical recording medium which is moving relative to the image of the laser diode array in order to scan the recording medium.

Each of the arrangements disclosed in U.S. Pat. Nos. 5,109,460 and 4,743,091 use individually packaged diode lasers in a closely packed array of diode lasers. The cost of packaging many lasers in such an arrangement is high. Still further, variations in each of the laser channels due to differences between the lasers and/or the optical fibers results in variations between the light spot shapes or intensities at the recording medium. It is preferable to use a monolithic array of diode lasers, namely, an array of diode lasers formed on a same wafer in one package, and thus reduce packaging costs and laser-to-laser variations.

U.S. Pat. No. 4,804,975 (K. Yip), issued on Feb. 14, 1989, discloses a thermal dye transfer apparatus which includes an array of diode lasers that illuminate a dye carrying donor medium. The donor medium absorbs heat from the laser light, and the dye is transferred by sublimation from the donor medium to a receiver member to form pixels of an image. Light from each of the diode lasers of the array is modulated to have different pixel densities in order to print the image on the receiver member. The light emitted from the diode lasers of the laser array is first collected by a collimating lens and then focused by a focusing lens onto the donor medium. Each of the diode lasers corresponds to a pixel in a line of the print image on the receiver member. However, since the diode lasers of the array are not closely packed due to a design limitation of such arrays, a result is that the laser light spots at the recording medium are also not closely packed. It is important to closely pack the laser light spots at the recording medium to minimize the field of the printing lens, and to create artifact-free solid patches of a transferred dye.

The prior art arrangements do not provide a cost effective solution since the prior art arrangements use a number of individually packaged diode lasers in a closely packed array of diode lasers while other prior art arrangements do not provide closely packed laser light spots at the recording medium. Therefore, it is desirable to provide cost effective methods and arrangements for using laser diode arrays in laser printers and recorders.

SUMMARY OF THE INVENTION

The present invention is directed to providing cost effective method and arrangements for using laser diode arrays in laser printers and recorders, and, more particularly, to the use of lenslet arrays with laser diode array for use in multibeam laser printers or recorders.

Viewed from a first aspect, the present invention is directed to a laser thermal printer comprising a plurality of diode lasers, a printing lens, optical means, and a lenslet array. The plurality of diode lasers are formed into a laser diode array, each diode laser generating a separate modulated diverging light beam of predetermined intensity at any instant of time and having a predetermined aperture. The printing lens has an entrance pupil for imaging the light beams from the laser diode array at a plane of the entrance pupil onto a printing media as a corresponding array of closely-spaced spots of predetermined intensities. The spots of the array have a spacing therebetween which is less than a spacing between the light beams generated by the laser diode array. The optical means reduces the aperture or divergence of the light beams from the plurality of diode lasers by a predetermined amount. Still further, the optical means continues the direction of the light beams onto the plane of the entrance pupil of the printing lens. The lenslet array comprises a separate lenslet for directing each of the light beams in a first cross-sectional direction along a width of the laser diode array towards a predetermined area on a plane in front of the printing lens. Still further, the lenslet array focuses each of the light beams in a second cross-sectional direction normal to the first cross-sectional direction onto the plane of the entrance pupil.

In a first embodiment of the laser thermal printer of the present invention, the lenslet array is disposed for receiving the light beams from the optical means, and for directly focusing and overlapping the light beams at a predetermined area of the entrance pupil of the printing lens.

In a second embodiment of the laser thermal printer of the present invention, the lenslet array substantially collimates the light beams from the optical means in the first cross-sectional direction, and directs the substantially collimated light beams parallel to each other towards the plane of the entrance pupil. A field lens receives the light beams from the lenslet array, and directly focuses and overlaps the light beams at the entrance pupil of the printing lens.

In a third embodiment of the laser thermal printer of the present invention, the plurality of diode lasers of the laser diode array are formed into a plurality of subarrays of closely-spaced diode lasers. Each subarray forms a separate multimode light source generating a separate multimode light beam, and the diode lasers of a subarray are concurrently driven by a separate current source. Still further, the lenslet array focuses each of the light beams from the optical means in the first cross-sectional direction onto a separate area of an exit plane disposed in front of a plane of an entrance pupil of a printing lens. A field lens receives the focused light beams from the exit plane, and to overlaps the light beams at the entrance pupil of the printing lens.

In a fourth embodiment of the laser thermal printer of the present invention, the plurality of diode lasers of the laser diode array are formed into a plurality of subarrays of diode lasers to form separate multimode light sources. Each subarray generates a separate multimode light beam, and the diode lasers of each subarray are concurrently driven by a separate current source. The laser thermal printer also comprises a micro lenslet array, and a field lens. The micro lenslet array comprises a separate micro lenslet associated with each diode laser of the subarrays of diode lasers. Each micro lenslet converts the diverging light beam from the corresponding diode laser into a collimated light beam. Each of the collimated light beams from a subarray substantially touches a light beam from an adjacent micro lenslet associated with a same subarray of diode lasers for forming a separate multimode light beam. Each of the multimode light beams is directly received by a separate lenslet of the lenslet array. The lenslet array focuses each of the multimode light beams along the first cross-sectional direction onto a separate area of an exit plane disposed in front of the plane of the entrance pupil of the printing lens. The field lens is disposed to receive the focused multimode light beams from the lenslet array, and to overlap the multimode light beams at the entrance pupil of the printing lens.

Viewed from a second aspect, the present invention is directed to a method of generating an array of closely-spaced spots of predetermined intensities on a printing media in a laser thermal printer from a plurality of diverging light beams generated by an array of diode lasers. In a first step, the plurality of light beams having predetermined intensities generated by the array of diode lasers are transmitted through an optical means for reducing the aperture or divergence of the light beams from the plurality of diode lasers by a predetermined amount. Still further, the optical means functions to continue the direction of the light beams onto a plane of an entrance pupil of a printing lens. In a second step, each of the light beams from the first step are transmitted through a separate lenslet of a lenslet array for directing each of the light beams in a first cross-sectional direction along a width of the laser diode array towards a predetermined area on the plane of the entrance pupil. Still further, each of the light beams are focused onto the plane of the entrance pupil in a second cross-sectional direction normal to the first cross-sectional direction. In a third step, the light beams from the laser diode array at the entrance pupil are imaged onto a printing media in the corresponding array of closely-spaced spots having the predetermined intensities.

The invention will be better understood from the following more detailed description taken with the accompanying drawings and claims.

BRIEF DESCRIPTION OF THE DRAWINGS

FIG. 2 is a cross-sectional view of a portion of the optical arrangement shown in FIG. 1 along a direction of a laser diode array in a laser thermal printer;

FIG. 3 is a cross-sectional view of the optical arrangement shown in FIG. 1 along a cross-array direction of a laser diode array in a laser thermal printer;

FIG. 5 is a cross-sectional view of a portion of the optical arrangement shown in FIG. 4 along a direction of a laser diode array in a laser thermal printer;

FIG. 6 is a cross-sectional view of the optical arrangement shown in FIG. 4 along a cross-array direction of a laser diode array in a laser thermal printer;

FIG. 7 is a cross-sectional view of an optical arrangement along a direction of a laser diode array in a laser thermal printer in accordance with a third embodiment of the present invention;

FIG. 8 a cross-sectional view of the optical arrangement shown in FIG. 7 along a cross-array direction of a laser diode array in a laser thermal printer; and FIG. 9 is a cross-sectional view of an optical arrangement along a direction of a laser diode array using subarrays of multiple diode lasers in a laser thermal printer in accordance with a fourth embodiment of the present invention;

The drawings are not necessarily to scale.

DETAILED DESCRIPTION

In the descriptions hereinafter of the various embodiments of the present invention, corresponding elements having the same function in the various figures are given the same designation number. It is to be understood hereinafter that although the present invention is described with reference to a laser thermal printer, the disclosed arrangements are applicable to optical storage systems.

Figure 1:
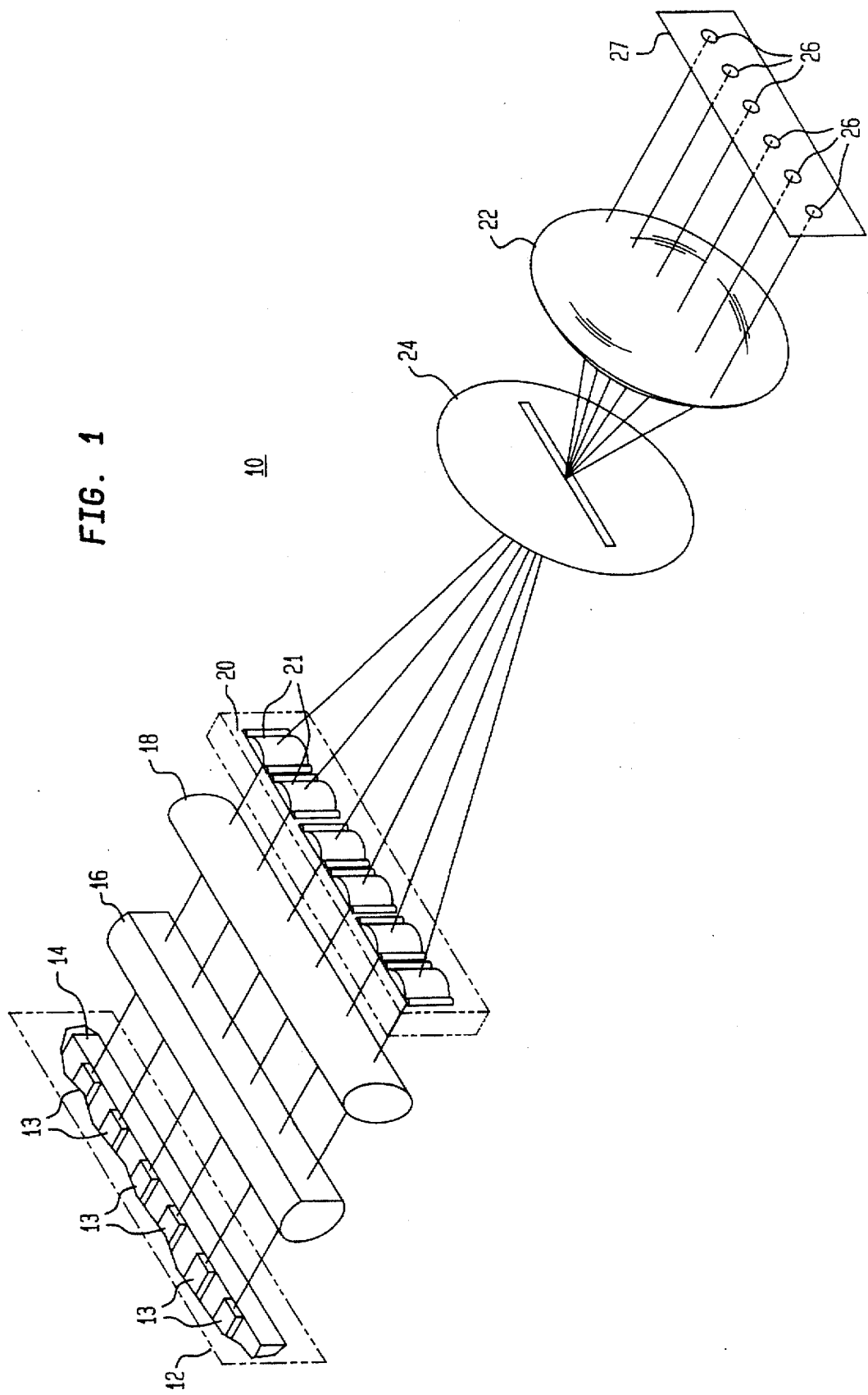
FIG. 1 is a view in perspective of an optical arrangement for use with a laser diode array in a laser thermal printer in accordance with a first embodiment of the present invention.

Referring now to FIGS. 1, 2, and 3, FIG. 1 shows a view in perspective of an optical arrangement 10 in accordance with a first embodiment of the present invention for use with a laser diode array 12 (shown within a dashed-line rectangle) in a laser thermal printer, FIG. 2 shows a cross-sectional view of a portion (only the light beams from three lasers 13 of the laser diode array 12) of the optical arrangement 10 along a direction of the laser diode array 12 of FIG. 1, and FIG. 3 shows a cross-sectional view of the optical arrangement 10 of FIG. 1 along a cross-array direction. The laser diode array 12 is a multi-mode laser diode array comprising a plurality of diode lasers 13 formed on a substrate 14. The optical arrangement comprises a first cylinder lens 16 having a first high numerical aperture (NA), a second cylinder lens 18 having a second low NA, a micro lenslet array 20, and a printing lens 22.

The laser diode array 12 comprises a number of independently modulated laser diode sources 13. Each source 13 comprises an ensemble of diode lasers (not shown). The diode lasers in the ensemble are pumped as one group. Even though each one of the diode lasers within a source 13 is a single mode laser, the source 13 is essentially a multimode laser since no attempt is made at optically coupling the diode lasers in the ensemble. The diode lasers making up a source 13 can be packed close to each other to form a source size of typically 100 to 200 microns in an array direction, or be spaced at equal distances within the source 13. In a cross-array direction, the light source size is typically in the submicron range. The larger the size of a light source in the array direction, the more power it can deliver. To achieve high power from the laser diode array 12, the number of light sources needs to be as high as possible. However, since the size of the laser diode array 12 is limited typically to approximately twelve millimeters, having a large number of independent light sources results in the light sources being too closely spaced which causes unwanted cross-talk. The cross-talk is in the form of electrical, thermal, and possible optical cross-talk which causes one channel to affect the other. Therefore, to avoid cross-talk, the laser diode array 12 has, for example, a total size in the array direction of twelve millimeters and comprises between five to twenty independently modulated light sources with distances therebetween of approximately 2000 to 500 microns, respectively.

The laser diode array 12 presents a difficulty in coupling its power into an optical system. In this regard see, for example, the article by J. Leger et al. entitled "Geometrical Transformation of Linear Diode-Laser Arrays For Longitudinal Pumping Of Solid-State Lasers" in *IEEE Journal of Quantum Electronics*, Vol. 28, No. 4, April 1992, at pages 1088–1100, where a problem of collecting light of an array of diode lasers into a fiber laser is addressed.

The laser diode array 12 can be used for printing in two ways. A first way is to image the laser array directly onto a print medium using imaging optics. The problem is that the optical throughput (or entendu) of such optics is large. More particularly, a two-dimensional product of the laser diode array area 12 and its solid angle is defined as the optical throughput or entendu, while a one-dimensional equivalent is the commonly-known Lagrange invariant. The Lagrange invariant is defined as the light source's "half-size" multiplied by the NA. In the cross-array direction, the Lagrange invariant is α/π, where α is the wavelength of the laser diode 13, which is a small number. However, in the array direction, the Lagrange invariant is large. More particularly, for the exemplary twelve millimeter array size, the Lagrange invariant is approximately six millimeters (one-half the array size) times the typical spread angle (NA) of 0.1. Generally, the optics associated therewith has to be highly anamorphic to deal with the large divergence of the lasers 13 in the cross-array direction which makes the optics usually rather complex.

In the prior art, the way to use the laser diode array 12 for printing is to directly image an array of independently modulated diode lasers as shown, for example, in U.S. Pat. No. 4,520,472 (C. Reno), issued on May 28, 1985. Such an arrangement is of a low performance in terms of a smallest spot size it can generate at the print medium since the arrangement "wastes" its throughput on the "dead space" between the diode laser sources. The present arrangements overcome the problems of the prior art techniques by using micro-optics with a laser diode array 12 of independently modulated diode lasers 13 for printing on a laser thermal printer. The micro-optics in combination with other lenses in accordance with the present invention provide an efficient transformation of light from the widely separated diode lasers 13 to a closer pack of printing spots 26 at a light sensitive media 27. The light sensitive media 27 commonly comprises a dye or ink donor web (not shown) and a receiver member (not shown) on a drum (not shown) of a laser thermal printer, but can also comprise a single donor sheet.

In the optical arrangement 10, the diverging modulated light beams with predetermined intensities from the laser diodes 13 of the laser diode array 12 are intercepted by the first cylinder lens 16 having a first high numerical aperture (NA). Although the first lens is designated a cylinder lens, it is to be understood that the first lens 16 can have cylinder surfaces or a hyperbolic surface. Cylinder lens 16 reduces the numerical aperture from, for example, 0.5 to 0.1. The second cylinder lens 18 (having a second low NA) is positioned in the direction of a width of the laser diode array 12 (e.g., along the line of diode lasers 13) to further modify the light beams from the laser diode array 12 and focus the substantially parallel light beams leaving the second cylinder lens 16 on a plane of an entrance pupil 24 of the printing lens 22. The entrance pupil 24 is located in a front focal plane of the printing lens 22. The lenslet array 20 intercepts the light beams from the second cylinder lens 16, and focuses and overlaps each of the light beams from the lasers 13 at the entrance pupil 24 in the direction of the laser diode array 12. The printing lens 22 then images the laser diode array 12 represented by the light beams at the entrance pupil 24 onto the light sensitive media 27 to form a line of closely spaced spots 26 of predetermined intensities.

More particularly, as is shown in FIG. 2, the lasers 13 have a divergence in the array direction (along the width of the laser diode array 12) of approximately 10° Full Width Half Max (FWHM) where the width of a light beam is at one-half its peak value. If it is assumed that the lasers 13 are separated by 800 microns, then at a distance of approximately four millimeters from the laser diode array 12, the light beams from adjacent lasers 13 will touch each other. Preferably, the lenslet array 20 is positioned at this location. Each lenslet 21 of the lenslet array 20 focuses the light beam of a corresponding laser 13 onto the entrance pupil 24 of the printing lens 22 which overlaps the other light beams focused by the other lenslets 21. The printing lens 22 is telecentric wherein a stop is at the entrance pupil 24 (front focal plane) and the light beams are perpendicular to the light sensitive media 27. FIG. 3 shows how the lasers 13 are shaped in the cross-array direction by the first cylinder lens 16 and the second cylinder lens 18 to focus the light beams at the plane of the entrance pupil 24 of the printing lens 22. The optical arrangement 10 of FIGS. 1, 2, and 3 is an "aperture imaging" system since the light sensitive media 27 is conjugated to a far field light distribution of the lasers 13 and not to the lasers 13 themselves. This optical arrangement achieves a low entendu and provides close packing of the laser spots 26 with predetermined intensities at the light sensitive media 27.

Figure 4:
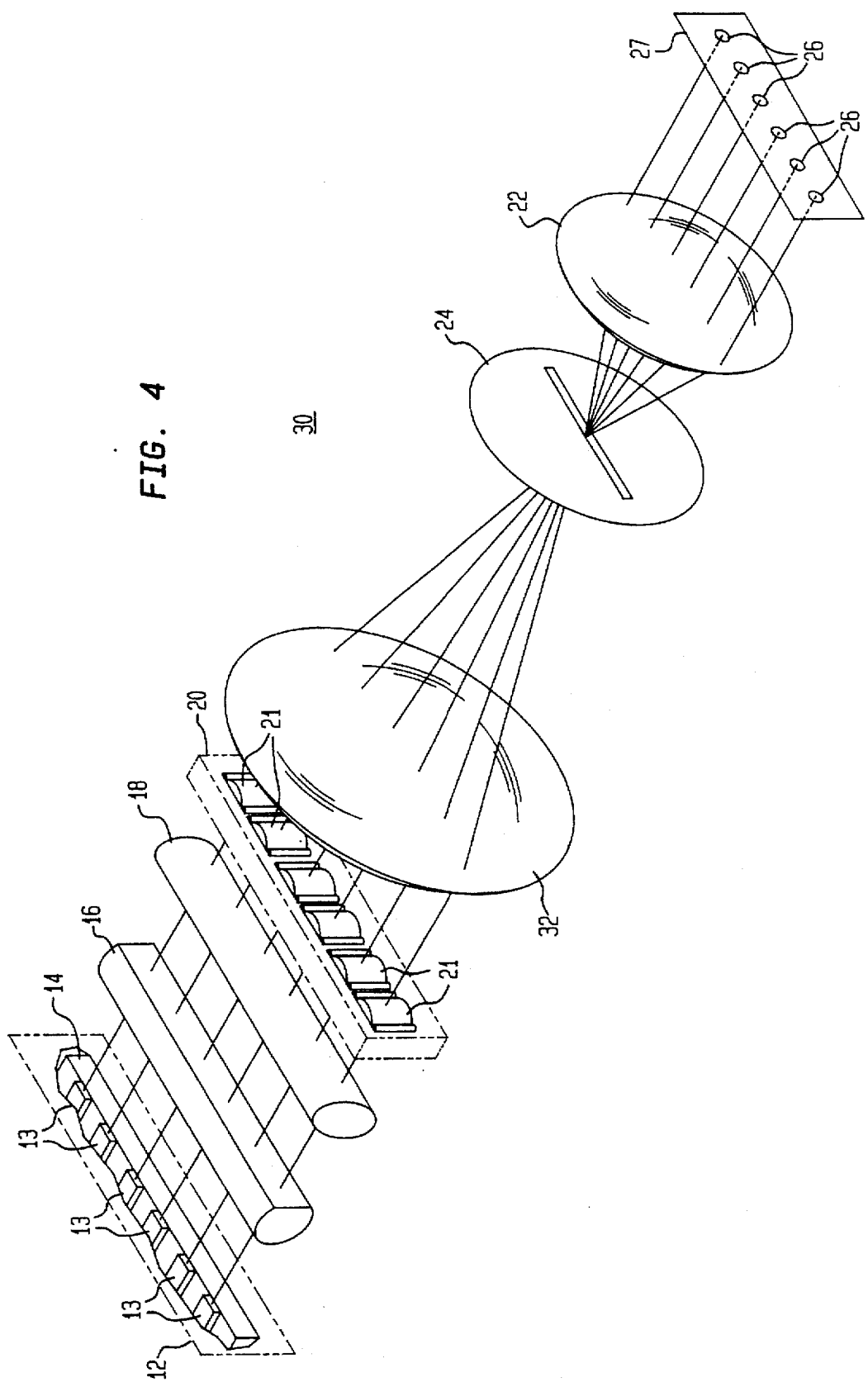
FIG. 4 is a view in perspective of an optical arrangement for use with a laser diode array in a laser thermal printer in accordance with a second embodiment of the present invention.

Referring now to FIGS. 4, 5, and 6, FIG. 4 shows a view in perspective of an optical arrangement 30 in accordance with a second embodiment of the present invention for use with a laser diode array 12 (shown within a dashed-line rectangle) in a laser thermal printer, FIG. 5 shows a cross-sectional view of a portion of the optical arrangement 30 of FIG. 4 in a direction along the laser diode array 12, and FIG. 6 shows cross-sectional view of the optical arrangement 30 of FIG. 4 in a cross-array direction of the laser diode array 12. The optical arrangement 30 comprises a first cylinder lens 16 having a first high numerical aperture (NA), a second cylinder lens 18 having a second low NA, a lenslet array 20, a field lens 32, and a printing lens 22. It is to be understood that each of the laser diode array 12, the first cylinder lens 16, the second cylinder lens 18, the lenslet array 20, and the printing lens 22 each function as described for optical arrangement 10 of FIGS. 1, 2, and 3.

In the optical arrangement 30, diverging modulated light beams with predetermined intensities from the lasers 13 of the laser diode array 12 are intercepted by the first cylinder lens 16 having a first high numerical aperture (NA). As stated hereinbefore, it is to be understood that the first lens 16 can have cylinder surfaces or a hyperbolic surface. The second cylinder lens 18 (having a second low NA) is positioned in the direction of the line of diode lasers 13 to further modify the parallel light beams from the laser diode array 12 so that the parallel light beams are slightly diverging in the direction of the laser diode array 12 and are focused at a plane of an entrance pupil 24 of the printing lens 22 in the cross-array direction. The entrance pupil 24 is located in a front focal plane of the printing lens 22. The lenslet array 20 is arranged to intercept the light beams from the second cylinder lens 16, and to collimate each of the light beams from the lasers 13.

More particularly, first and second cylinder lenses 16 and 18 are positioned in relation to lenslet array 20 so that the light beams emerge from the lenslet array 20 as collimated light beams which are parallel to each other. The field lens 32 accepts these collimated and parallel light beams from the lenslet array 20, and overlaps these light beams at the entrance pupil 24. The printing lens 22 then images the laser diode array represented by the light beams at the entrance pupil 24 onto the light sensitive media 27 to form a line of closely spaced spots 26 of predetermined intensities. An advantage of optical arrangement 30 is that the laser diode head, comprising the laser diode array 12, cylinder lenses 16 and 18, and lenslet array 20, is less tightly configured and doesn't have to fit a certain printing lens 22. Instead, when a different printing lens 22 is used, only the field lens 32 has to be changed.

Referring now to FIGS. 7 and 8, FIG. 7 is a cross-sectional view of an optical arrangement 40 in accordance with a third embodiment of the present invention in a direction along a laser diode array 42 (shown within a dashed-line rectangle) in a laser thermal printer, and FIG. 8 is a cross-sectional view of the optical arrangement 40 of FIG. 7 in a cross-array direction of the laser diode array 42. The optical arrangement 40 comprises a first cylinder lens 16 having a first high numerical aperture (NA), a second cylinder lens 18 having a second low NA, a lenslet array 20, a field lens 44, and a printing lens 22. It is to be understood that each of the first cylinder lens 16, the second cylinder lens 18, the lenslet array 20, and the printing lens 22 each function as described for optical arrangement 10 of FIGS. 1, 2, and 3.

In the optical arrangement 40, the laser diode array 42 comprises a plurality of multimode sources 43, where each multimode source 43 comprises a plurality of closely-packed diode lasers (not shown) all driven by a same modulating current source (not shown). Diverging modulated parallel light beams with predetermined intensities from the multimode sources 43 of the laser diode array 42 are intercepted by the first cylinder lens 16 having a first high numerical aperture (NA). As stated hereinbefore, it is to be understood that the first lens 16 can have cylinder surfaces or a hyperbolic surface. The second cylinder lens 18 (having a second low NA) is positioned in the direction of the line of multimode sources 43 to further change the divergence of the light beams from the laser diode array 42 and focus the light beams at an entrance pupil 24 of the printing lens 22 (as shown in FIG. 8) in a cross-array direction. The entrance pupil 24 is at a front focal plane of the printing lens 22. The lenslet array 20 intercepts the light beams from the second cylinder lens 16 and functions to focus each of the light beams from the multimode sources 43 to produce separate spots (not shown) at an exit plane 45 in front of the field lens 44 in the direction of the laser diode array 12.

More particularly, the first and second cylinder lenses 16 and 18 are positioned in relation to lenslet array 20 so that the light beams emerge parallel to each other from the lenslet array 20 and are focused at the exit plane 45 in the direction of the laser diode array 12. The field lens 44 then directs the slowly diverging light beams leaving the exit plane 45 towards a common central area of the entrance pupil 24 so that the light beams overlap each other at the entrance pupil 24. In other words, a central ray 47 of each light beam intersects other central rays 47 of the other light beams at a common point at the entrance pupil 24. The printing lens 22 then images plane 45 onto the light sensitive media 27 to form a line of closely spaced spots 26 of predetermined intensities.

In optical arrangement 40, the multimode sources 43 are first imaged in the array direction and magnified by the first and second cylinder lenses 16 and 18 so that the different individual multimode source images (not shown) are almost touching before being focused by the lenslet array 20 onto the exit plane 45. The field lens 44 is then used to direct the light from all multimode sources 43 to the entrance pupil 24 of the printing lens 22. The printing lens 22 conjugates the laser source 43 images onto the light sensitive media 27 as a line of spots 26 having predetermined intensities. It is to be understood that such imaging can also be achieved without the field lens 44 by building the function of the field lens 44 into the lenslet array 20 as was done in optical arrangement 10 of FIGS. 1, 2, and 3.

Referring now to FIG. 9, there is shown a cross-sectional view of a portion of an optical arrangement 50 in accordance with a fourth embodiment of the present invention in a direction of a laser diode array 52 (shown within a dashed-line rectangle) in a laser multibeam printer. The optical arrangement 50 is similar to the optical arrangement 40 of FIG. 7, and only the area of difference between the optical arrangements 40 and 50 is shown in FIG. 9. The optical arrangement 50 comprises a first cylinder lens 16 having a first high numerical aperture (NA), a second cylinder lens 18 having a second low NA, a micro lenslet array 54 (shown within a dashed-line rectangle), a lenslet array 20 (shown within a dashed-line rectangle), a field lens 44, and a printing lens 22 (only shown in FIG. 7). It is to be understood that each of the first cylinder lens 16, the second cylinder lens 18, the lenslet array 20, the field lens 44, and the printing lens 22 each function as described for optical arrangement 10 of FIGS. 1, 2, and 3.

In optical arrangement 50, the laser diode array 52 comprises of a plurality of multimode sources (only a first and part of a second multimode source are shown within a separate bracket). Each multimode source comprises a sub-array of equally spaced laser diodes 53 which are all concurrently driven as a group to generate separate diverging and parallel light beams including a predetermined light intensity. The parallel diverging light beams from the laser diodes 53 of each multimode source are each directed through the first cylinder lens 16 and at corresponding separate micro lenslets 55 of the micro lenslet array 54. The micro lenslets 55 associated with a multimode source are arranged in a plane normal to the direction of the associated light beams from the associated multimode source and have their perimeters contacting each other. Each micro lenslet 55 collimates the light beam from the corresponding laser diode 53. The collimated and touching light beams from the micro lenslets associated with a multimode source form a combined multimode light beam. The combined multimode light beam from each multimode source is directed at a separate lenslet 21 of the lenslet array 20. Each lenslet 21 images the light beam from an associated multimode source through the second cylinder lens 18 and onto an exit plane 45 of the field lens 44. As is shown in FIG. 7, the field lens 44 is then used to direct the light from all multimode sources to an entrance pupil 24 of the printing lens 22 which conjugates the multimode source images onto the light sensitive media 27 as a line of spots 26 with predetermined intensities. The difference between optical arrangements 50 and 40 is that the micro lenslet array 54 in optical arrangement 50 forms the beams emanating from the dispersed sources 53 to be equivalent to the light beams in the optical arrangement 40 emanating from the compact sources 43.

In the optical arrangement 50, the arrangement of multimode sources with equally spaced laser diodes 53 is advantageous for heat management. By displacing the diode lasers 53 from each other, spaces are created between the laser diodes 53 which increases the Lagrange invariant. As stated hereinbefore, is it desirable that the Lagrange invariant be a small as possible. In order to reduce this increased Lagrange invariant caused by the spaced-apart laser diodes 53, a set of micro lenslets 55 (one for each laser diode 53) is used.

It is to be appreciated and understood that the specific embodiments of the invention described hereinbefore are merely illustrative of the general principles of the present invention. Various modifications may be made by those of ordinary skill in the art which are consistent with the principles set forth. For example, in the optical arrangement 50 of FIG. 9, the function of the micro lenslets 53 can be combined in the lenslet array 20 to form one component. Still further, a single mode diode laser array can be used with all of the optical arrangements 10, 20, 30, 40, and 50. Furthermore, in the optical arrangements 10, 20, 30, 40, and 50, the lenslet arrays 20 and the micro lenslet subarrays 54 are preferably optic binary lenslet arrays which are diffractive devices. However, it is to be understood that the lenslet arrays 20 and the micro lenslet array 54 can be refractive lenslet arrays and subarrays. An advantage of using the binary lenslet arrays 20 and subarrays 54 is that they are produced using the same microlithographic methods used for making lasers. Therefore, masks can be produced to manufacture the binary elements in exactly the right dimensions to fit the lasers, etc. Additionally, it is to be understood that the term "light" used hereinbefore is broadly used to refer to visible and infrared electromagnetic radiation.

What is claimed is:

1. A laser multibeam printer comprising:

a monolithic laser diode array comprised of a plurality of diode lasers, each of the diode lasers generating a separate one of a plurality of modulated diverging light beams having a predetermined intensity at any instant of time and having predetermined emitting source size, each of the diode lasers spaced from adjacent diode lasers by at least the size of the emitting source size;

a printing lens having an entrance pupil for imaging each of the light beams from the laser diode array at a plane of the entrance pupil onto a light sensitive media as a corresponding compact array of spots of predetermined intensities with a spacing between the spots less than the size of the spot;

optical means for reducing the aperture or divergence of each of the light beams from the plurality of diode lasers by a predetermined amount, and for directing each of the light beams onto the plane of the entrance pupil of the printing lens;

a lenslet array comprising a separate lenslet associated with each of the light beams, wherein each said lenslet directs said associated one of the light beams in a first cross-sectional direction along a width of the laser diode array towards a predetermined area on a plane in front of the printing lens, for focusing each of said light beams in a second cross-sectional direction onto the plane of the entrance pupil, wherein:
the lenslet array substantially collimates each of the light beams from the optical means in the first cross-sectional direction, and directs each of the substantially collimated light beams parallel to each other towards the plane of the entrance pupil; and a field lens which receives each of the light beams from the lenslet array and focuses and overlaps each of the light beams at the entrance pupil of the printing lens.

2. A laser multibeam printer comprising:

a laser diode array comprised of a plurality of diode lasers, each of the diode lasers generating a separate one of a plurality of modulated diverging light beams of a predetermined intensity at any instant of time and having predetermined emitting source size, each of the diode lasers spaced from adjacent diode lasers by at least the size of the emitting source size;

a printing lens having an entrance pupil for imaging each of the light beams from the laser diode array received at the entrance pupil onto a light sensitive media as a corresponding compact array of spots of predetermined intensities with a spacing between the spots less than the size of the spot;

a first cylinder lens having a first numerical aperture for collecting each of the diverging light beams from the laser diode array, and for reducing the aperture or divergence of each of the beams from the plurality of diode lasers by a predetermined amount;

a second cylinder lens having a second numerical aperture which is less than the first numerical aperture for collecting each of the light beams from the first cylinder lens, for further shaping each of the light beams, and for continuing the direction of each of the light beams onto a plane of the entrance pupil of the printing lens;

a lenslet array comprising a separate lenslet for each of the light beams for directing each of the light beams in a first cross-sectional direction along a width of the laser diode array towards a predetermined area on a plane in front of the printing lens, and for focusing each of the light beams in a second cross-sectional direction normal to the first cross-sectional direction onto the entrance pupil wherein:
the lenslet array substantially collimates each of the light beams from the second cylinder lens in the first cross-sectional direction, and directs each of the substantially collimated light beams parallel to each other towards the plane of the entrance pupil; and a field lens which receives each of the substantially collimated light beams from the lenslet array and focus and overlap each of the light beams at the entrance pupil of the printing lens.

3. A method of generating an array of closely-spaced spots of predetermined intensities on a light sensitive media in a laser multibeam printer from a plurality of diverging light beams of predetermined intensities generated by a monolithic array of laser diodes, said printer including a printing lens having an entrance pupil, the method comprising the steps of:

(a) transmitting the plurality of light beams generated by the array of laser diodes through an optical means for reducing the aperture or divergence of the light beams from the plurality of diode lasers by a predetermined amount in a first cross-sectional direction;

(b) transmitting the light beams from step (a) through a separate lenslet of a lenslet array for directing each of the light beams in a second cross-sectional direction, normal to the first cross-sectional direction, along a width of the laser diode array towards a predetermined area on a plane of the entrance pupil;

(b1) receiving each of the light beams from the optical means at the lenslet array; and (b2) arranging the lenslet array for directly focusing and overlapping each of the light beams at the entrance pupil of the printing lens;

(c) focusing each of the light beams from the lenslet array onto the plane of the entrance pupil; and (d) imaging each of the light beams from the entrance pupil onto a light sensitive media in a corresponding array of closely-spaced spots.

4. A method of generating an array of closely-spaced spots of predetermined intensities on a light sensitive media in a laser multibeam printer from a plurality of diverging light beams of predetermined intensities generated by a monolithic array of laser diodes, said printer including a printing lens having an entrance pupil, the method comprising the steps of: intensities generated by a monolithic array of laser diodes, said printer including a printing lens having an entrance pupil, the method comprising the steps of:

(a) transmitting each of the plurality of light beams generated by the array of laser diodes through an optical means for reducing the aperture or divergence of each of the light beams from the plurality of diode lasers by a predetermined amount in a first cross-sectional direction;

(a1) forming the plurality of diode lasers of the laser diode array into a plurality of subarrays of closely-spaced diode lasers for forming separate multimode light sources generating separate multimode light beams, each of the subarrays being driven by a separate current source, and each of the diode lasers of a subarray being driven concurrently;

(a2) transmitting each of the plurality of multimode light beams generated by the subarrays of laser diodes through a first cylinder lens having a numerical aperture for collecting the diverging light beams from the laser diode array, and for reducing the aperture of divergence of each of the light beams from the plurality of diode lasers by a predetermined amount; and (a3) collecting each of the light beams from the first cylinder lens by a second cylinder lens having a second numerical aperture which is less than the first numerical aperture for further shaping the light beams, and for continuing the direction of the light beams onto a plane of the entrance pupil of the printing lens;

(b) transmitting each of the light beams from step (a) through a separate lenslet of a lenslet array for directing each of the light beams in a second cross-sectional direction, normal to the first cross-sectional direction, along a width of the laser diode array towards a predetermined area on a plane of the entrance pupil;

(c) focusing each of the light beams from the lenslet array onto the plane of the entrance pupil; and (d) imaging each of the light beams from the entrance pupil onto a light sensitive media in a corresponding array of closely-spaced spots.

5. A method of generating an array of closely-spaced spots of predetermined intensities on a light sensitive media in a laser multibeam printer from a plurality of diverging light beams of predetermined intensities generated by a monolithic array of laser diodes, said printer including a printing lens having an entrance pupil, the method comprising the steps of:

(a) transmitting each of the plurality of light beams generated by the array of laser diodes through an optical means for reducing the aperture or divergence of each of the light beams from the plurality of diode lasers by a predetermined amount in a first cross-sectional direction;

(a1) forming the plurality of diode lasers of the laser diode array into a plurality of subarrays of closely-spaced diode lasers for forming separate multimode light sources generating separate multimode light beams, each of the subarrays being driven by a separate current source, and each of the diode lasers of a subarray being driven concurrently;

(a2) transmitting each of the plurality of multimode light beams generated by the subarrays of laser diodes through a first cylinder lens having a numerical aperture for collecting the diverging light beams from the laser diode array, and for reducing the aperture of divergence of each of the light beams from the plurality of diode lasers by a predetermined amount; and (a3) collecting each of the light beams from the first cylinder lens by a second cylinder lens having a second numerical aperture which is lass than the first numerical aperture for further shaping the light beams, and for continuing the direction of the light beams onto a plane of the entrance pupil of the printing lens;

(b) transmitting each of the light beams from step (a) through a separate lenslet of a lenslet array for directing each of the light beams in a second cross-sectional direction, along a width of the laser diode array towards a predetermined area on the plane of the entrance pupil;

(c) focusing each of the light beams from the lenslet array onto the plane of the entrance pupil; and (d) imaging each of the light beams from the entrance pupil onto a light sensitive media in a corresponding array of closely-spaced spots.

* * * * *